US007837929B2

(12) United States Patent
Gaydos et al.

(10) Patent No.: US 7,837,929 B2
(45) Date of Patent: Nov. 23, 2010

(54) METHODS OF MAKING MOLYBDENUM TITANIUM SPUTTERING PLATES AND TARGETS

(75) Inventors: Mark Gaydos, Nashua, NH (US); Prabhat Kumar, Framingham, MA (US); Steven A. Miller, Canton, MA (US); Norman C. Mills, Phoenix, AZ (US); Gary Rozak, Akron, OH (US); Rong-Chein Richard Wu, Chelmsford, MA (US)

(73) Assignee: H.C. Starck Inc., Newton, MA (US)

( * ) Notice: Subject to any disclaimer, the term of this patent is extended or adjusted under 35 U.S.C. 154(b) by 0 days.

(21) Appl. No.: 11/255,018

(22) Filed: Oct. 20, 2005

(65) Prior Publication Data

US 2007/0089984 A1    Apr. 26, 2007

(51) Int. Cl.
    *B22F 3/02*    (2006.01)
(52) U.S. Cl. .......................................... 419/42; 75/245
(58) Field of Classification Search ................ 419/8, 419/49, 31, 28, 42; 75/248, 245; 204/298.13
    See application file for complete search history.

(56) References Cited

U.S. PATENT DOCUMENTS

| 4,208,257 | A |   | 6/1980 | Hom-ma et al. ......... 204/129.65 |
|---|---|---|---|---|
| 4,647,426 | A | * | 3/1987 | Fiorentino ................... 419/31 |
| 4,820,393 | A |   | 4/1989 | Brat et al. ............... 204/192.15 |
| 5,234,487 | A | * | 8/1993 | Wickersham et al. ......... 75/248 |
| 5,397,050 | A |   | 3/1995 | Mueller ..................... 228/193 |
| 5,429,877 | A |   | 7/1995 | Eylon .......................... 428/586 |
| 5,435,965 | A |   | 7/1995 | Mashima et al. ................ 419/8 |
| 5,733,427 | A | * | 3/1998 | Satou et al. ............ 204/298.13 |
| 5,857,611 | A |   | 1/1999 | Gilman et al. ............... 228/193 |
| 5,895,663 | A |   | 4/1999 | Irwin et al. |
| 5,896,553 | A |   | 4/1999 | Lo .............................. 419/23 |
| 5,963,778 | A |   | 10/1999 | Stellrecht .................... 428/554 |
| 6,010,583 | A |   | 1/2000 | Annavarapu et al. ......... 148/513 |

(Continued)

FOREIGN PATENT DOCUMENTS

CN    1676661    10/2005

(Continued)

OTHER PUBLICATIONS

Contribute to the Development of Light Metal through Encouragement and Promotion of Research Study Education, Published in Surface and Coating Technology, vol. 169-170, pp. 151-154 (month unavailable) 2003, H. Habazaki et al, Formation of Barrier-type Amorphous Anodic Films on Ti-Mo Alloys, pp. 1-3.

(Continued)

*Primary Examiner*—George Wyszomierski
*Assistant Examiner*—Weiping Zhu
(74) *Attorney, Agent, or Firm*—Connolly Bove Lodge & Hutz LLP (57) ABSTRACT

Molybdenum titanium sputter targets are provided. In one aspect, the targets are substantially free of the β(Ti, Mo) alloy phase. In another aspect, the targets are substantially comprised of single phase β(Ti, Mo) alloy. In both aspects, particulate emission during sputtering is reduced. Methods of preparing the targets, methods of bonding targets together to produce large area sputter targets, and films produced by the targets, are also provided.

22 Claims, 7 Drawing Sheets

U.S. PATENT DOCUMENTS

| | | | |
|---|---|---|---|
| 6,042,777 A | 3/2000 | Lo et al. | 419/8 |
| 6,071,389 A | 6/2000 | Zhang | 204/298.12 |
| 6,165,413 A | 12/2000 | Lo et al. | 419/49 |
| 6,183,686 B1 | 2/2001 | Bardus et al. | 419/8 |
| 6,328,927 B1 | 12/2001 | Lo et al. | 419/45 |
| 6,419,806 B1 | 7/2002 | Holcomb et al. | 204/298.12 |
| 6,521,108 B1 | 2/2003 | Zhang | 204/298.13 |
| 6,619,537 B1 | 9/2003 | Zhang et al. | 228/194 |
| 6,638,381 B2 | 10/2003 | Keener et al. | 148/669 |
| 6,726,787 B2 | 4/2004 | Chern Lin et al. | 148/669 |
| 6,755,948 B1 | 6/2004 | Fukuyo et al. | 204/298.13 |
| 2005/0122443 A1 | 6/2005 | Kim et al. | 349/46 |
| 2005/0189401 A1 | 9/2005 | Butzer et al. | 228/194 |
| 2005/0191202 A1* | 9/2005 | Iwasaki et al. | 419/28 |
| 2005/0230244 A1 | 10/2005 | Inoue et al. | |
| 2005/0279630 A1 | 12/2005 | Fonte | 204/298.21 |

FOREIGN PATENT DOCUMENTS

| | | |
|---|---|---|
| EP | 1612292 A1 | 1/2006 |
| JP | 2003226966 A * | 8/2003 |
| JP | 2004-204253 | 7/2004 |
| WO | WO-2004090194 | 10/2004 |

OTHER PUBLICATIONS

International Search Report issued in International Application No. PCT/US2006/040214, 4 Pages, Jun. 29, 2007 mailing date.

Chinese office action in Chinese counterpart dated Jan. 22, 2010 (in Chinese).

Translation of Chinese office action dated Jan. 22, 2010 from the Chinese agent, Shanghai Patent & Trademark Law Office, LLC. dated Feb. 25, 2010.

* cited by examiner

METHODS OF MAKING MOLYBDENUM TITANIUM SPUTTERING PLATES AND TARGETS

FIELD OF THE INVENTION

This invention relates to molybdenum-titanium sputter targets having low particulate emissions. The targets can be bonded together to make a large area targets useful in the production of certain types of thin films, such as those used to make flat panel displays such as thin film transistor-liquid crystal displays (TFT-LCDs).

BACKGROUND INFORMATION

Sputtering is a technique used to produce a metallic layer in various manufacturing processes used in the semiconductor and the photoelectric industries. The properties of films formed during sputtering are related to the properties of the sputtering target itself, such as the size of the respective crystal grain and the formation of secondary phase with distribution characteristics. It is desirable to produce a sputter target that will provide film uniformity, minimal particle generation during sputtering, and the desired electrical properties.

Various sputtering techniques are used in order to effect the deposition of a film over the surface of a substrate. Deposited metal films, such as metal films on a flat panel display device, can be formed by a magnetron sputtering apparatus or other sputtering techniques. The magnetron sputtering apparatus induces plasma ions of a gas to bombard a target, causing surface atoms of the target material to be ejected and deposited as a film or layer on the surface of a substrate. Conventionally, a sputtering source in the form of a planar disc or rectangle is used as the target, and ejected atoms travel along a line-of-sight trajectory to deposit on top of a wafer whose deposition face is parallel to the erosion face of the target. Tubular-shaped sputtering targets can also be used, as described in co-pending application Ser. No. 10/931,203.

Sputtering targets may be desired which comprise materials or combinations of materials that cannot be made by conventional means such as rolling. In such cases, targets are made by hot isostatic pressing (HIP) powders. Ideally, the target is made in a single step. However, physical limitations of powder packing density and size of HIP equipment make it necessary to join smaller segments in order to produce large sputtering targets. For single-phase targets, conventional processing such as welding may be used; for multi-phase materials or where alloy formation is to be avoided for any reason, solid-state edge to edge bonding is preferred.

Interconnects in semiconductors and TFT-LCDs are evolving from aluminum and toward copper, thus new diffusion barriers are needed. Titanium provides excellent adhesion properties while the molybdenum contributes its dense barrier stability. Integrated circuits (for semiconductors and flat panel displays) use Mo—Ti as an underlayer or capping layer for aluminum, copper, and aluminum alloys to minimize hillocks formation, to control the reflectivity and provide protection from chemical attack during photolithography.

U.S. Pat. No. 5,234,487 describes methods of producing tungsten-titanium sputter targets with little or no $\beta$(Ti, W) alloy phase. U.S. Pat. No. 5,896,553 describes a titanium-tungsten sputter target which is substantially all single phase $\beta$(Ti, W). Neither patent discloses the use of other materials as substitutes for tungsten.

U.S. Patent Application Publication 20050189401 discloses a method of making a large Mo billet or bar for a sputtering target wherein two or more bodies comprising Mo are placed adjacent one another (e.g. stacked one on the other) with Mo powder metal present at gaps or joints between the adjacent bodies. The adjacent bodies are hot isostatically pressed to form a diffusion bond at each of the metal-to-Mo powder layer-to-metal joint between adjacent bodies to form a billet or bar that can be machined or otherwise formed to provide a large sputtering target. This patent publication discloses bonding of major side surfaces, not edge-to-edge bonding of plates.

SUMMARY OF THE INVENTION

In one aspect, the present invention provides a method for preparing a molybdenum-titanium sputtering target having substantially no $\beta$(Ti, Mo) phase present, the method comprising the steps of:

(a) providing powders of molybdenum and titanium wherein said titanium powder is present in an amount of about 5-95 atomic %, based on the total atomic % of the molybdenum and titanium powders, the balance being molybdenum powder;

(b) blending the molybdenum and titanium powders to produce a blended powder;

(c) optionally, consolidating the blended powder;

(d) encapsulating the consolidated powder; and (e) compacting while heating the encapsulated powder to produce a first MoTi target plate.

The method can further comprise the steps of:

(f) removing a portion of the encapsulation on the first target plate;

(g) bonding the first target plate to a second MoTi target plate along an edge of the first and second plates to produce bonded plates; and (h) compacting while heating the bonded plates to produce a bonded target plate. The bonded target plate is at least 55 inches by 67 inches in area.

In an additional aspect, the present invention provides a method of preparing a molybdenum-titanium sputtering target having a single $\beta$(Ti,Mo) phase, the method comprising the steps of:

(a) providing powders of molybdenum and titanium wherein said titanium powder is present in an amount of about 5-95 atomic %, based on the total atomic % of the molybdenum and titanium powders, the balance being molybdenum powder;

(b) blending the molybdenum and titanium powders to produce a blended powder;

(c) optionally, consolidating the blended powder;

(d) encapsulating the consolidated powder; and (e) compacting while heating the encapsulated powder to produce a MoTi target plate having a single $\beta$(MoTi) phase.

In yet another aspect, the present invention provides a method of bonding two or more sputter target plates together to produce a large area sputter target, the method comprising:

(a) cleaning an edge of each of the two or more target plates;

(b) optionally, providing a bonding material on an edge of at least one of the two or more target plates to be bonded;

(c) encapsulating the two or more target plates; and (d) compacting while heating the two or more target plates to produce a large area sputter target plate, wherein the large area sputter target plate is at least 55 inches by 67 inches in area.

The present invention also provides a molybdenum-titanium sputtering target having an area of at least 55 inches by 67 inches.

In additional aspects the present invention further provides a molybdenum-titanium sputtering target having substantially no β(Mo, Ti) alloy phase; and a molybdenum-titanium sputtering target having a single β(Mo, Ti) alloy phase. These and other aspects of the present invention will become more readily apparent from the following figures, detailed description and appended claims.

BRIEF DESCRIPTION OF THE DRAWINGS

The invention is further illustrated by the following drawings in which.

DETAILED DESCRIPTION OF PREFERRED EMBODIMENTS

As used herein in the specification and claims, including as used in the examples and unless otherwise expressly specified, all numbers may be read as if prefaced by the word "about", even if the term does not expressly appear. Also, any numerical range recited herein is intended to include all subranges subsumed therein.

In one aspect of the present invention, a sputtering target of Mo and Ti is made having substantially zero Mo—Ti alloy phase. As used herein, "substantially zero" means from about 15% (by volume) or less β(Ti, Mo). Mo—Ti targets in accordance with the invention preferably comprise from trace to 12% by volume of undesirable β(Ti, Mo), most preferably from trace to 10% by volume β(Ti, Mo), as determined by SEM-EDS analysis. Another method of determining alloy formation is by X-ray diffraction techniques. These targets have a density of about 95% of the theoretical density or greater.

In another aspect of the present invention, a sputtering target of Mo and Ti is made having substantially all single phase β(Ti, Mo) alloy. SEM-EDS analysis of the microstructure of a target is used to determine if the target microstructure consists of multiple phases of Mo and Ti, or if a single β(Mo, Ti) phase is formed.

Figure 1A:
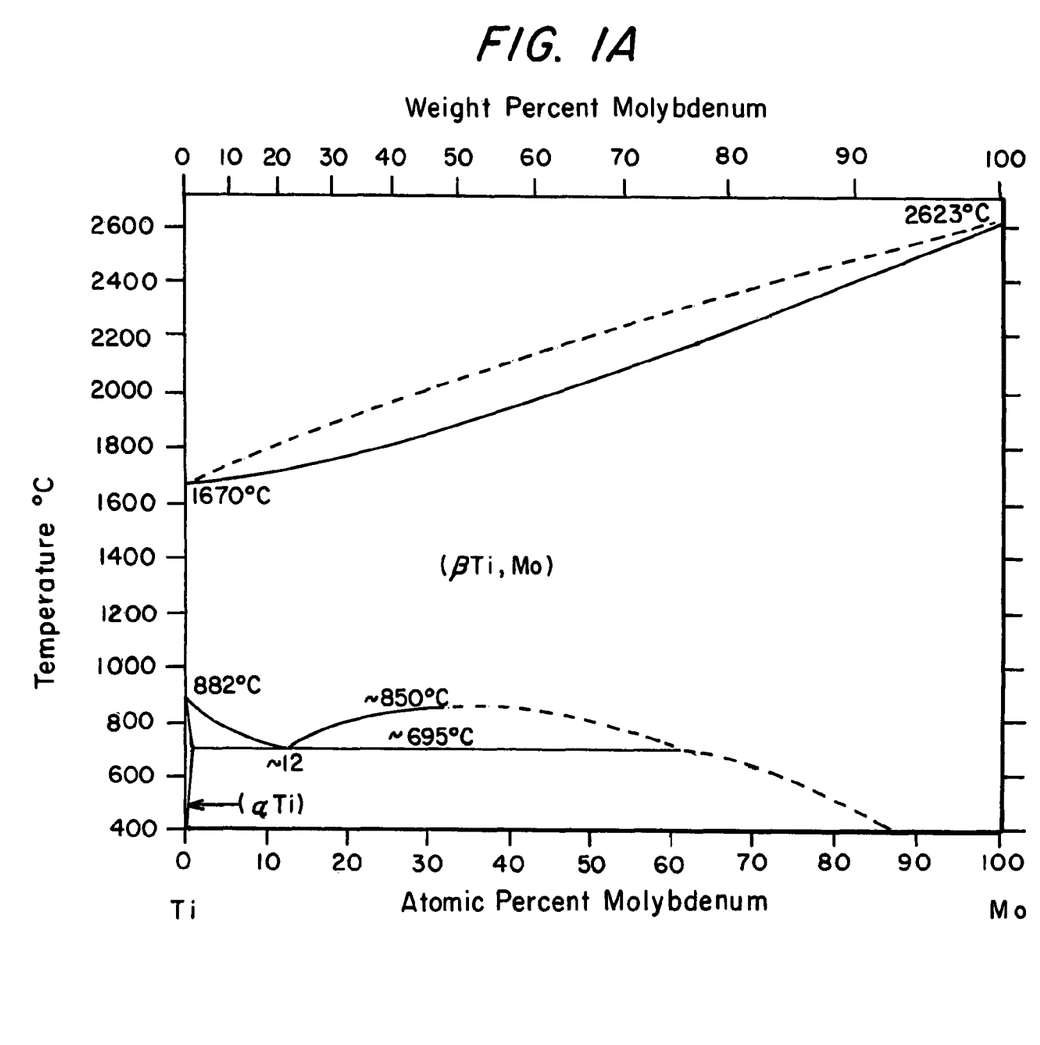
FIGS. 1A and 1B are phase diagrams of molybdenum-titanium alloy formation.
Figure 1B:
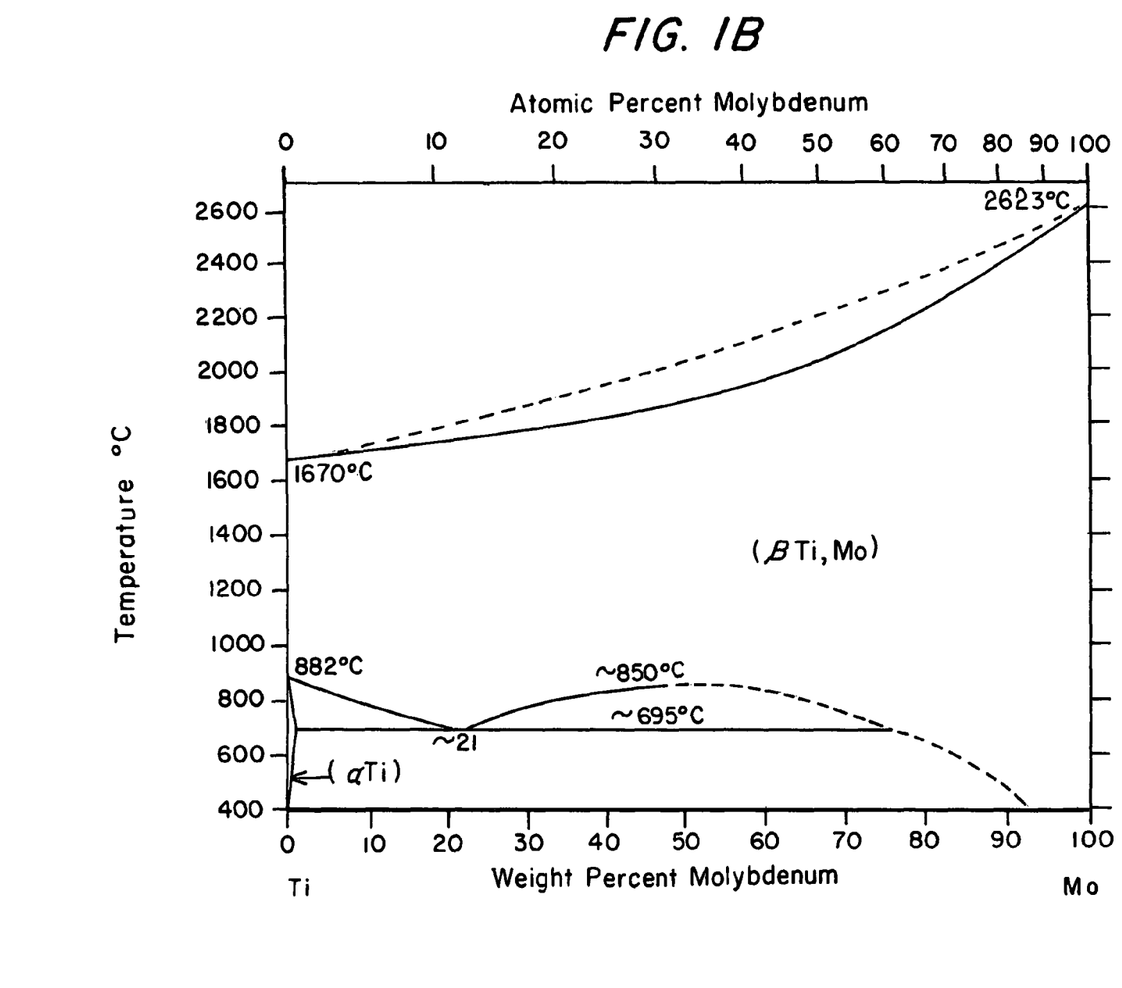
Figure 2A:
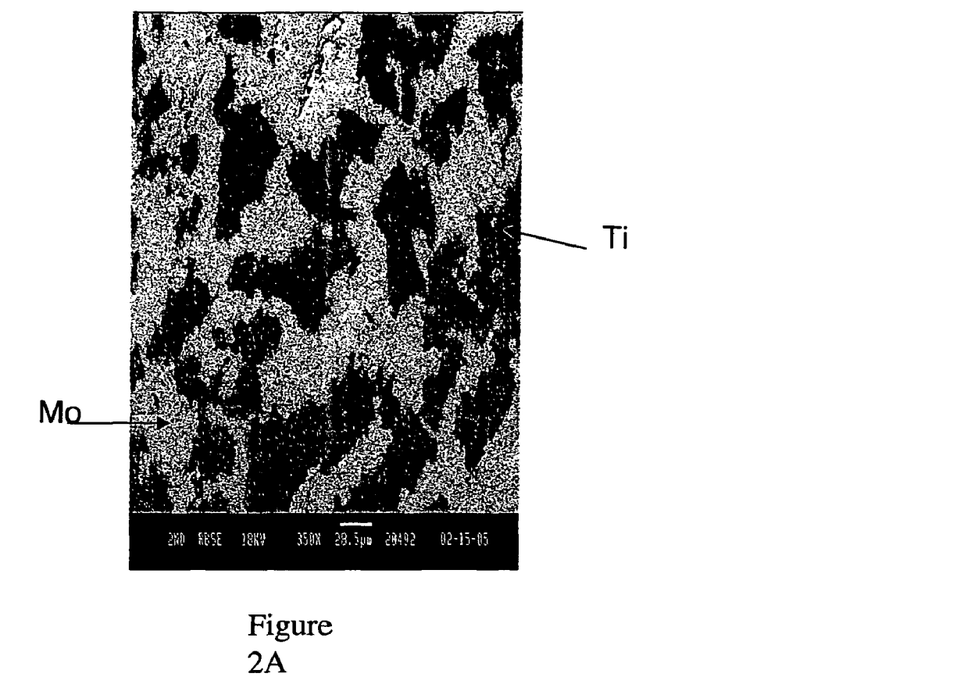
FIG. 2A is an SEM micrograph of a sample subjected to HIP for 4 hours at 690° C., 15,000 psi.
Figure 2B:
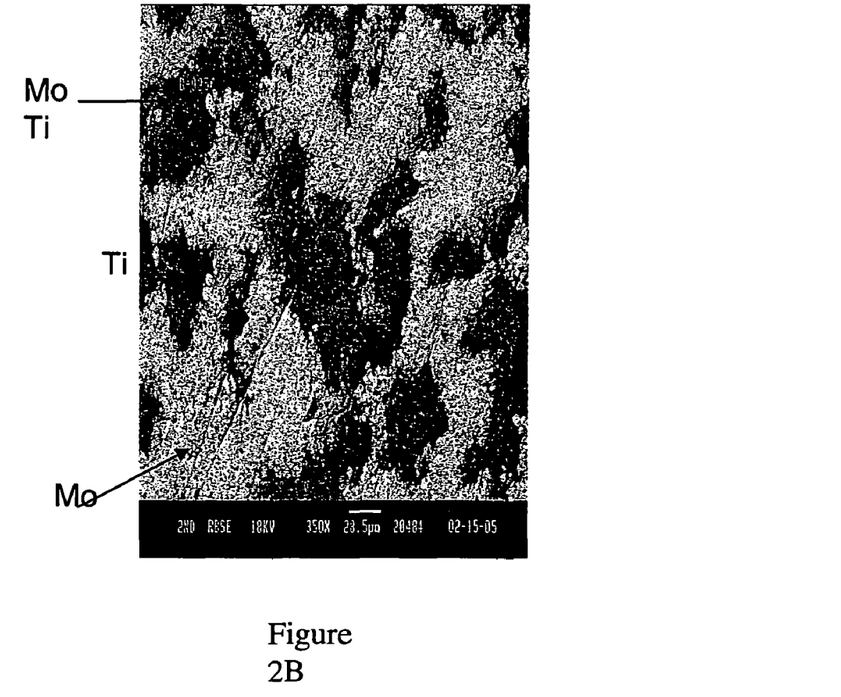
FIG. 2B is an SEM micrograph of a sample subjected to HIP for 4 hours at 825° C., 15,000 psi.
Figure 2C:
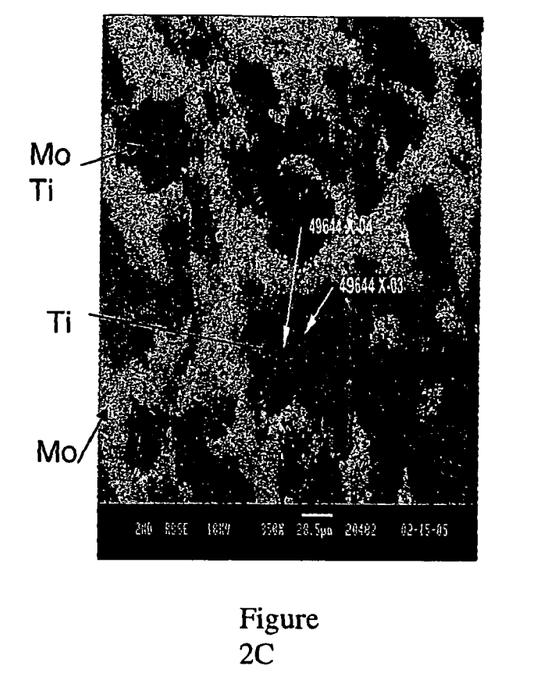
FIG. 2C is an SEM micrograph of a sample subjected to HIP for 4 hours at 925° C., 15,000 psi.
Figure 2D:
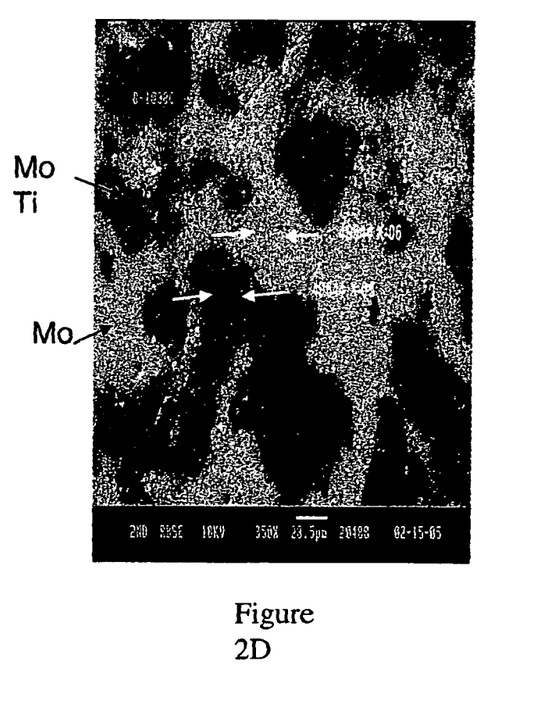
FIG. 2D is an SEM micrograph of a sample subjected to HIP for 4 hours at 1038° C., 15,000 psi.
Figure 3A:
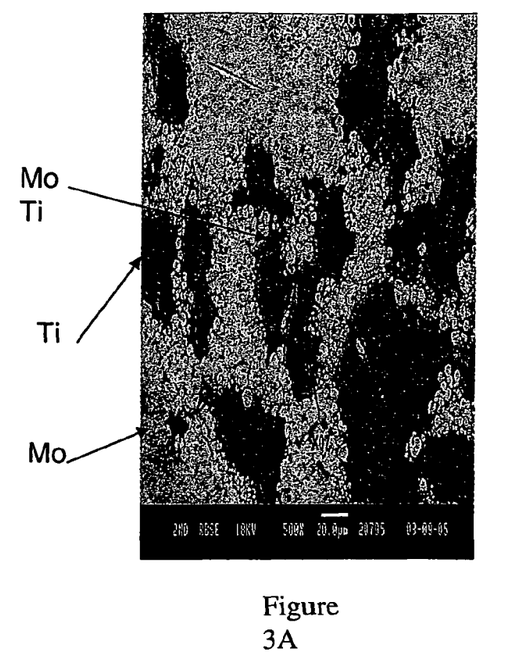
FIG. 3A is an SEM micrograph of a sample subjected to HIP for 8 hours at 725° C., 15,000 psi.
Figure 3B:
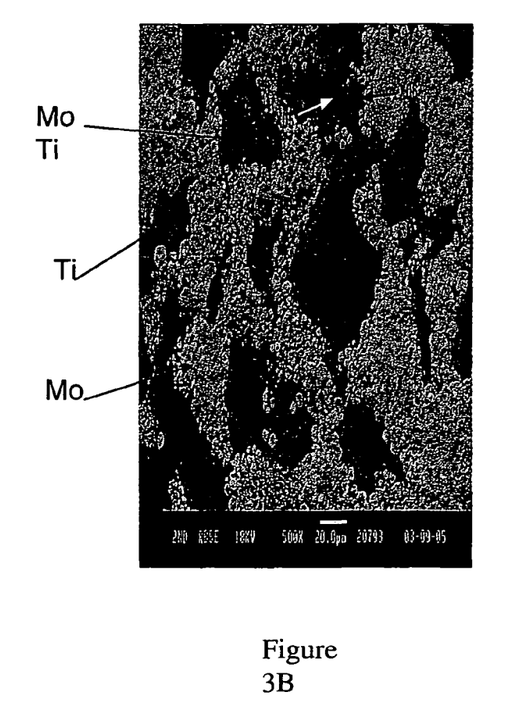
FIG. 3B is an SEM micrograph of a sample subjected to HIP for 8 hours at 750° C., 15,000 psi.
Figure 3C:
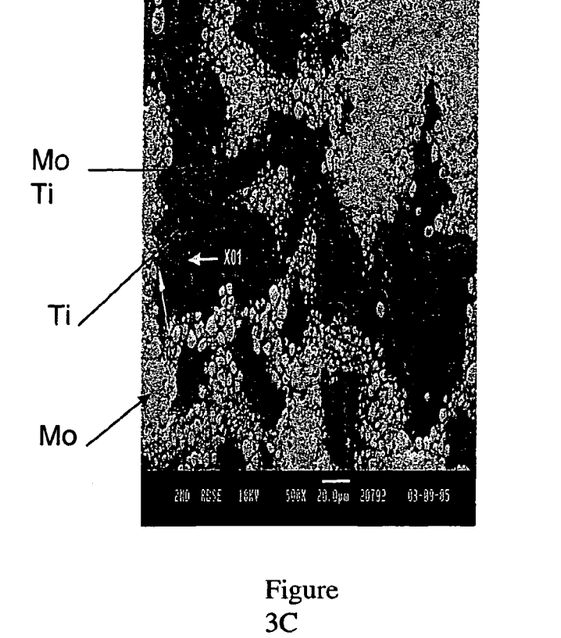
FIG. 3C is an SEM micrograph of a sample subjected to HIP for 8 hours at 780° C., 15,000 psi.
Figure 3D:
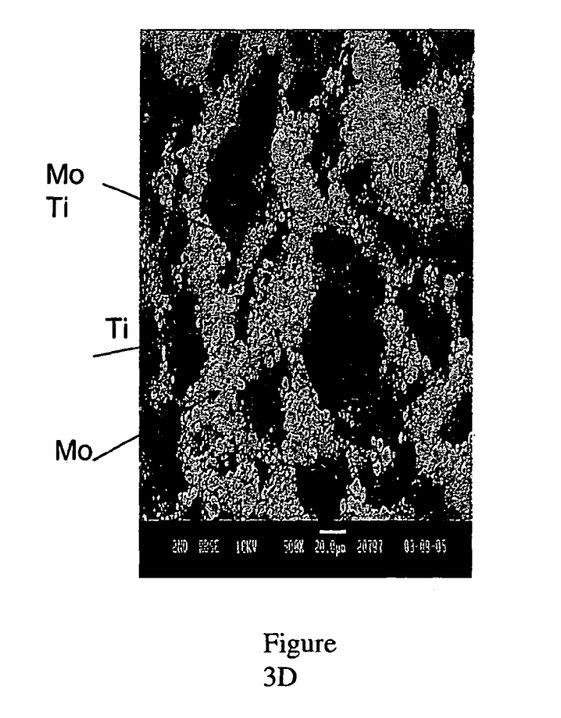
FIG. 3D is an SEM micrograph of a sample subjected to HIP for 4 hours at 750° C., 15,000 psi.
Figure 4A:
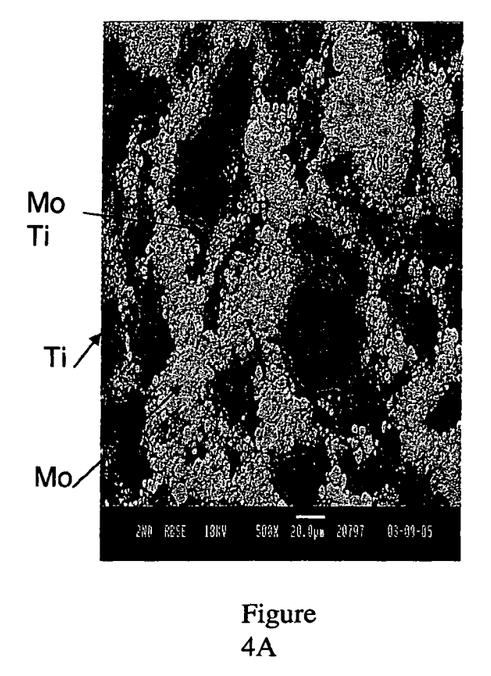
FIG. 4A is an SEM micrograph of a sample subjected to HIP for 4 hours at 750° C., 15,000 psi.
Figure 4B:
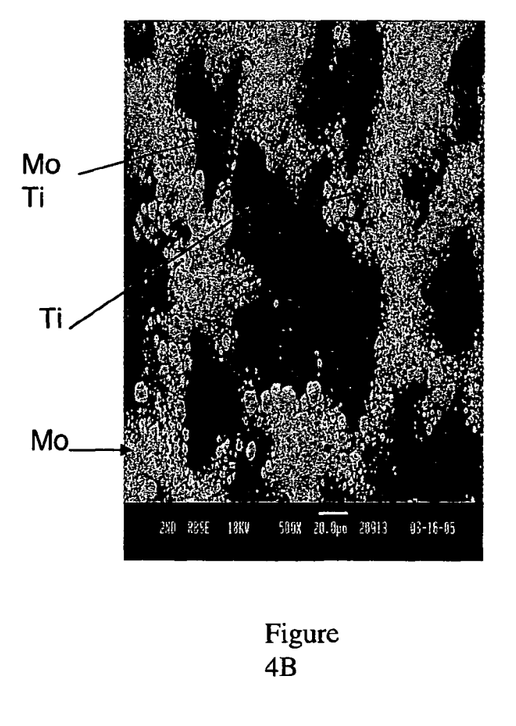
FIG. 4B is an SEM micrograph of a sample subjected to Re-HIP for 4 hours at 825° C., 15,000 psi.

The phase diagram for Mo—Ti shown in FIG. 4 and taken from Massalski, Binary Alloy Phase Diagrams Vol. 2, Ed. T. B. Massalski, ASM International, Metals Park, Ohio, pp. 1640, indicates that in order to avoid formation of the β(Ti, Mo) phase during processing of Mo—Ti alloys the processing temperature should be equal or below the monotectoid temperature of 695°±20° C. Accordingly, one method of reducing the formation of β(Ti, Mo) in a sputter target is to manufacture and use the part in a manner that prevents the target temperature from exceeding this monotectoid temperature. In practice, the temperature of forming the target will be slightly higher because slightly higher temperatures provide better consolidation.

Alternatively, and as indicated in the phase diagram, use of temperatures above 695° C., under equilibrium conditions, will result in single phase alloy formation.

The amounts of titanium and molybdenum will vary depending on the desired properties of the film to be produced from the sputtering target. Typically, titanium powder will be present in an amount of about 5-95 atomic %, based on the total atomic % of the molybdenum and titanium powders, the balance being molybdenum powder. For some applications, the powder will comprise 40-60 atomic % titanium, with the balance molybdenum; for others the powder will comprise 50 atomic % titanium and 50 atomic % molybdenum.

The particle sizes of the molybdenum and titanium powders may be varied in accordance with the principles of the present invention. When a target having substantially zero alloy phase is desired, the preferred average particle size of the molybdenum powder is in the range of 2 to 150 microns, more preferably 10-30 microns. The average particle size of the titanium powder is in the range of 40 to 150 microns, more preferably 40-60 microns. Both the molybdenum and titanium should be high purity powders, with both the molybdenum and titanium powders having at least 99.5% purity.

When a single alloy phase target is desired, smaller particle sizes are used. The average particle size for the molybdenum powder is preferably between 0.1-25 microns, more preferably less than 5 microns. For the titanium powder, the desired average particle size is preferably 5-50 microns, more preferably 25-35 microns.

The molybdenum and titanium powders are blended in accordance with powder blending techniques that are well known in the art. For example, mixing may occur by placing the molybdenum and titanium powders in a dry container and rotating the container about its central axis. Mixing is continued for a period of time sufficient to result in a completely blended and uniformly distributed powder. A ball mill or similar apparatus may also be used to accomplish the blending step. The invention is not limited to any particular mixing technique, and other mixing techniques may be chosen if they will sufficiently blend the molybdenum and titanium starting powders.

The blended powder is optionally then consolidated in a preliminary compacting step to a density which is from 60-85% of theoretical density. The consolidation can be accomplished by any means known to one skilled in the art of powder metallurgy, such as by cold isostatic pressing, rolling or die compaction. The length of time and amount of pressure used will vary depending on the degree of consolidation desired to be achieved in this step For some types of targets, such as tubular, this step may not be necessary.

Following the preliminary consolidation step the consolidated powder is encapsulated, such as in a mild steel can. Encapsulation can also be accomplished by any method that will provide a compact workpiece that is free of an interconnected surface porosity, such as by sintering, thermal spraying, and the like. As used herein, the term "encapsulation" will refer to any method known to one skilled in the art for providing the compact piece free of interconnected surface porosity. A preferred method of encapsulation is by use of the steel can.

After encapsulation the encapsulated piece is compacted under heat and pressure. Various compacting methods are known in the art, including, but not limited to, methods such as inert gas uniaxial hot pressing, vacuum hot pressing, and hot isostatic pressing, and rapid omnidirectional compaction, the Ceracon™ process. Preferably, the encapsulated piece is hot isostatically pressed into the desired target shape, as that method is known in the art, under pressure of 75-300 MPa, more preferably 100-175 MPa, at temperatures of 725°-925° C., more preferably 750°-850° C., for a period of 2-16 hours, more preferably 4-8 hours. Other methods of hot pressing can be used to produce the Mo—Ti sputtering targets of the present invention, so long as the appropriate temperature, pressure and time conditions are maintained.

After the final compaction step the target plate can be machined to the desired size and shape, and optionally bonded to a backing plate, as is known in the art, to produce the final sputtering target.

Finished sputter targets of the present invention have a density of greater than about 90% theoretical density and preferably at least 95% of theoretical density.

When a larger sputter target is desired, two or more target plates of the present invention can be bonded together in an edge-to-edge fashion. In other embodiments, the bonding method described below can be used to bond target plates made from other materials to make a larger sputtering target. Such materials include, but are not limited to, Ti—W, Zr—Mo, Al—Nd, Nb—Mo, Al—Si, Ni—Ti, Fe—Ti, Fe—Tb, Al—Zr, Nb—Ti, and other aluminum, chromium, niobium, zirconium, iron, and tantalum alloys, and the like. Other bonding materials will be used, depending on the composition of the materials in the target.

When bonding target plates having substantially zero β(Ti, Mo) alloy phase, bonding is desired to be accomplished while still maintaining discrete elemental phases and without a great increase in the amount of the alloy, in this case, MoTi. Thus, conditions for bonding should be at a temperature high enough to affect bonding but not so high as to promote alloy formation. The type of bond medium is also a factor in controlling alloy formation. In the case of the Mo—Ti system, possible bond materials include titanium powder, titanium sheet, foil, foam, expanded metal, combined titanium and molybdenum powders or molybdenum powder or combinations of these. It is also possible to weld two or more plates together, as welding methods are known in the art.

The bonding method of the present invention may have applicability in systems unrelated to sputtering where the presence of brittle or low strength phases, e.g., order intermetallics or Laves phases, would make rolling or welding problematic. For example, titanium forms many such phases when combined with Fe, Ni and Co.

In the bonding method of the present invention, the edges of plates or segments to be joined are machined and cleaned to present suitable surfaces for bonding. Typically, the target plate is a slab between ½ and 36 inches in thickness, and therefore the surface to be bonded is no more than 36 inches thick. More typically, the surface to be bonded is between 4 and 8 inches thick. If the bonding material is other than powder, cleaning is done by a method that leaves no residue. Bonding is accomplished by placing the bonding material between the machined surfaces, and placing the assembly in a container, such as a mild steel can, that is capable of being hermetically sealed and of a construction that is capable of withstanding the temperatures and pressures encountered in a vacuum pump. The container and assembly may be heated to assist in removal of gases and moisture. The container is then hermetically sealed and placed in a HIP vessel for consolidation.

Consolidation is accomplished using pressures and temperatures as described above, 75-300 MPa, more preferably 100-175 MPa, at temperatures of 700°-950° C., more preferably 750°-850° C., for a period of 2-16 hours, more preferably 4-8 hours. Following HIP, the container is removed by mechanical means or by acid digestion.

The large area plates of the present invention will preferably be at least 55 inches (1400 mm) by 67 inches (1700 mm), sometimes at least 60 inches by at least 95 inches.

EXAMPLES

The following examples are intended to illustrate the invention and should not be construed as limiting the invention in any way.

Example 1

Preparation of Target

In order to select HIP conditions, sub-sized specimens were made by Vendor A and Vendor B. Vendor A's specimens finished at a diameter of about 0.5-in by 5-in. long. Vendor B's specimens were about 2-in. in diameter by 3-in. long.

Powder Blending

Titanium powder (Grade Ti-050, 100/325 mesh from Micron Metals) and molybdenum powder (MMP-7, −100 mesh, from H. C. Starck) were blended in a V-blender in proportions to achieve 33.3% Ti (by weight). Blending time was adjusted to achieve uniform distribution. No protective atmosphere was used during blending or discharging of the blenders.

CIP

Blended powders at Vendor A were Cold Isostatically Pressed (CIP) at 19,000 psi to approximately 60% theoretical density (about 4.3 g/cc). The Vendor B specimens were CIP'd at 30,000 psi and achieved densities from 64% to 70% of theoretical (4.6 to 5 g/cc).

Encapsulate, Out-Gas & HIP

CIP'd compacts were placed into steel cans (C1018, drawn-over-mandrel seamless tubing, ⅛" wall) with a Mo-foil barrier between the compact and the can wall. The canned compacts were heated to approximately 200° C. under dynamic vacuum until they could achieve an internal pressure of 10μ and a leak-up rate of no more than 100 μ/min. Cans were then sealed by means known in the art using a process comprising crimping, cutting and fusing the cut end of their evacuation tubes.

Out-gassed and sealed can assemblies were Hot Isostatically Pressed (HIP) for four hours at 15,000 psi at various temperatures. Vendor A used 680°, 750°, 825°, 950° and 1038° C.; Vendor B used 690°, 825°, 925° and 1040° C.

Results

Samples were cut from each of the test billets and evaluated for density, microstructure by metallographic examination and SEM-EDS, and hardness. Density results are summarized in Table 1. Densities, as measured by the Archimedes method, from Vendor B followed predicted behavior; however, densities of samples HIP'd at Vendor A were lower than expected and showed non-uniform deformation.

TABLE 1

Densities in g/cc after HIP for 4 hours at 15,000 psi

|  | 680° C. | 690° C. | 750° C. | 825° C. | 925° C. | 950° C. | 1038° C. | 1040° C. |
|---|---|---|---|---|---|---|---|---|
| Vendor B |  | 6.73 |  | 7.14 | 7.22 |  | 7.27 |  |
| Vendor A | 6.2 |  | 6.5 | 6.52 |  | 6.99 |  | 7.10 |

Metallographic examination revealed the microstructure to be Mo particles embedded in a titanium matrix. Surrounding the Ti particles is an alloy phase of Mo dissolved in Ti. FIGS. 2A-2D show examples of the progression of increasing alloy phase with HIP temperature. Phase analysis of the samples to determine composition of the alloy was done using Energy Dispersive Spectroscopy on a Scanning Electron Microscope (SEM-EDS). The images, taken in the secondary electron mode, highlight the atomic number contrast. Titanium appears darkest, molybdenum appears lightest and the gray of the alloy phase is between the two. Although not readily detectable in these images, a compositional gradient exists in the alloy phase, with the highest Mo content found bordering the patches of Mo, and the lowest Mo is found adjacent to the Ti patches. The lightest gray phase in molybdenum. The sample from 690° C. shows only Mo and Ti. At 825° C., there is a third phase present. The lightest gray is Mo, the darkest gray is Ti, and surrounding the Ti is an alloy phase that contains 10% to 20% Mo, by weight. At 925° C., very little pure Ti remains, and at 1038° C. the microstructure comprises Mo and an alloy of Ti with about 25% Mo by weight.

Microstructure and density vs. HIP temperature indicated that the optimum temperature for the first HIP may be in the range of 720° C. to 780° C. Three additional runs were made at 725°, 750° and 780° C., all for eight hours at 15,000 psi. These were evaluated for density, microstructure, hardness and alloy phase composition. Results of those tests show an improvement in densification over that predicted from the plot of density and temperature for the four-hour runs made previously. SEM photo-micrographs for these runs are shown in FIGS. 3A-3D. For comparison, HIP for four hours at 750° C. and 15,000 psi resulted in a density of 7.07 g/cc.

TABLE 2

Densification response at 15,000 psi for 8 hours

|  | HIP temperature | | |
|---|---|---|---|
|  | 725° C. | 750° C. | 780° C. |
| Density (g/cc) | 7.05 | 7.11 | 7.14 |

Concurrently, a large block of MoTi was CIP'd at 19,000 psi by Vendor A to 6.8" by 6¾" by 17¼" and about 65% dense (4.78 g/cc) and HIP'd for four hours at 15.00 psi and 750° C. to finish at a size of approximately 5¾" by 5½" by 15½" (5.697"×5.425"×15.406" at its smallest dimensions).

Producing monolithic targets with dimensions in excess of 1550 mm from powder is beyond the current equipment capability and requires joining segments. Joining may be accomplished by a second HIP operation; however, conditions must be carefully selected to avoid the formation of the alloy phase.

Following HIP at 750° C. for four hours at 15,000 psi, samples were re-HIPed at 825° for four hours at 15,000 psi. FIGS. 4A-4B shows typical microstructure resulting from the additional HIP cycle. The relative proportion of the MoTi alloy phase has increased in the sample from 825° C. over that of the 750° C. sample, but the re-HIP'd microstructure is qualitatively similar to that of the 825° C. sample in FIG. 2. Density has increased to 7.20 to 7.22 g/cc in the sample re-HIP'd at 825° C. as compared to the density after a single HIP cycle at 825° C., 4 hours, 15,000 psi (7.14 g/cc).

Example 2

Bonding

Blended Mo and Ti powders at a ratio of 50 atomic percent each were cold isostatically pressed to approximately 65% to 75% theoretical density to form a block approximately 6-in. by 6-in. by 20-in. and encapsulated in a steel can using methods known in the art. The powder-filled can was hot isostatically pressed for four hours at 15,000 psi and 750° C. The consolidated compact was removed from the steel can and cut into slices approximately 5½-in. by 5½-in. by 1-in. Surfaces to be bonded were machined flat and four pairs of slices were each encapsulated in steel cans as before with the bond material between the slices. The slices were oriented in the can to make a sandwich approximately 2-inches thick. The bonding agents examined were: blended Mo and Ti powders at a ratio of 50 atomic percent each, Ti powder (to finish at 0.15 to 0.17-in. thick), and Ti foil (0.035-in. thick). One set of slices had nothing between them. The assemblies were hot isostatically pressed for four hours at 15,000 psi and 825° C.

After hot isostatic pressing, the assemblies were removed from the steel cans. Five specimens, each at ½-in. by ¼-in. by 1¼-in. were cut from each bonded assembly. The bond was at the mid-length location each specimen. All of these specimens were evaluated for transverse rupture strength in the bond area per ASTM B528. Additionally, a set of five specimens were produced from a block that had been hot isostatically pressed at the same conditions. These specimens had no bond and were to provide a measure of the strength of the Mo—Ti metal matrix composite. Table 3 below shows a summary of the results.

TABLE 3

| Bond Material | Mean/ ksi | Std. Dev./ ksi |
|---|---|---|
| Mo + Ti powder, 50 a/o | 116.0 | 6.03 |
| Ti Powder | 167.5 | 3.88 |
| None | 111.4 | 13.70 |
| Ti foil | 136.0 | 11.08 |
| Mo—Ti Matrix | 168.1 | 6.81 | n = 5 for each condition

Example 3

Thin Film Deposition

Magnetron sputtering was used as a means for deposition of molybdenum-titanium thin films onto substrates such as glass, silicon wafers and stainless steel.

1. Burn in. The burn in procedure employed was as follows: Power applied to the target was ramped from 0 W to 100 W, maintained at constant power for 10 minutes, ramped to a 1000 W over a period of 50 minutes and then maintained constant at 1000 W for 2 hours.

2. Deposition procedure and parameters. Prior to deposition, the silicon, stainless steel (AISI 304), soda lime glass, and Corning 1737 glass substrates were subjected to chemical cleaning by successive rinsing in ultrasonic baths of acetone and ethyl alcohol. The substrates were then blown dry in nitrogen and loaded into the deposition chamber.

The chamber was pumped down to pressures lower than $5 \times 10^{-6}$ Torr and filled with argon to $6.5 \times 10^{-3}$ Torr for sputter etching of the surface. In this step a negative voltage of 400V pulsing at 100 kHz was applied to the substrate for 30 minutes, accelerating argon ions to the substrate.

After sputter cleaning the substrates, the argon flow was reduced to $2 \times 10^{-3}$ Torr (2 mTorr) and the target was sputter cleaned at 500 W (DC) for 5 minutes.

The deposition on the substrates was performed on the power mode (fixed power applied to the target) under different conditions where: gas pressure and time were varied. Table 4 lists the parameters employed.

TABLE 4

Parameters for deposition at 1000 W, with substrate at 0 V, grounded.

| Time | Gas pressure (mTorr) | | | | |
|---|---|---|---|---|---|
| | 1 | 2 | 3 | 4 | 5 |
| 1 h | x | x | X | x | X |
| ~2 min | x | | x | | x |

3. Substrate Source Spacing (SSS): SSS was maintained at 5".

4. Deposition Rate. The deposition rates of Mo—Ti coatings on Si and Corning 1737 glass substrates were determined by the film cross-section thickness as measured with SEM.

TABLE 5

Deposition rate (μm/h) for films deposited at 0 V (grounded)

| | Gas pressure (mTorr) | | | | | | Std. |
|---|---|---|---|---|---|---|---|
| | 1 | 2 | 3 | 4 | 5 | Avg. | dev. |
| Target Mo—Ti on Corning 1737 (μm/h) | 5.85 | 6.04 | 6.43 | 6.28 | 6.55 | 6.23 | 0.255 |
| Target Mo—Ti on Si (μm/h) | 5.66 | 5.64 | 6.5 | 6.5 | | 6.08 | 0.425 |

5. Microstructure. With the decrease of deposition pressure, Mo—Ti coatings became denser, as observed by SEM. Coatings on Corning 1737 glass substrates were denser than on Si substrates.

6. Adhesion (Tape test). Adhesion of Mo—Ti coatings was measured by tape test. Mo—Ti coatings on Corning 1737 glass with thickness around 200 nm demonstrated much better adhesion than those coatings on stainless steel and soda lime glass substrates with thickness around 5 μm, possibly due to better chemical bonding and smaller total stress.

TABLE 6a

Tape test results of Mo—Ti coatings with thickness around 200 nm on Corning 1737 glass substrates

| | 1 mTorr | 3 mTorr | 5 mTorr |
|---|---|---|---|
| Target Mo—Ti | 5B | 5B | 5B |

TABLE 6b

Tape test results of Mo—Ti coatings with thickness around 5 μm on stainless steel and soda lime substrates.

| | 1 mTorr | 2 mtorr | 3 mTorr | 4 mtorr | 5 mTorr |
|---|---|---|---|---|---|
| Target Mo—Ti on stainless steel | 0B | 0B | 1B | 0B | 1B |
| Target Mo—Ti on soda lime glass | 0B | 0B | 0B | 0B | 0B |

The adhesion tape test performed was based on the following ASTM standards:

ASTM standard D:3359-02: "Standard Tests Methods for Measuring Adhesion by Tape Test"

ASTM standard B 905-00: "Standard Methods for Assessing the Adhesion of Metallic and Inorganic Coatings by the Mechanized Tape Test".

7. Etch rate. Etch rate of Mo—Ti coatings on Si substrates were measured by immersing the coatings in Ferricyanide solution at 25° C. for 30 minutes. Etch rates of Mo—Ti coatings were lower than those of Mo—NbZr and pure Mo coatings.

TABLE 7

Etch rate of molybdenum coatings produced at 1000 W for 1 hour, 0 V bias (grounded) in Ferricyanide solution at 25° C.

| Deposition pressure (mTorr) | Etch rate Target Mo—Ti (μm/min) |
|---|---|
| 1 | 0.063 |
| 2 | 0.064 |
| 3 | 0.098 |
| 4 | 0.081 |
| 5 | 0.078 |
| average | 0.077 |

8. Resistivity. The sheet resistance of selected molybdenum films was measured using a four-point probe. Results are presented in Table 8. The resistivity of Mo—Ti coatings were higher than those of pure Mo coatings for films deposited under the conditions mentioned above.

TABLE 8

Sheet resistance and resistivity values for films deposited under different deposition conditions

| | Parameters | | | Measurements | | |
|---|---|---|---|---|---|---|
| | Pressure (mTorr) | Power (W) | Time (s) | Thickness (nm) | Sheet resistance (Ω/) | Resistivity (μΩ·cm) |
| Target Mo—Ti | 1 | 1000 | 117 | 179 | 4.45 | 79.6 |
| | 3 | 1000 | 109 | 182 | 4.50 | 81.9 |
| | 5 | 1000 | 108 | 170 | 4.58 | 78 |

With the decrease of deposition pressure, Mo—Ti coatings became denser. Coatings on Corning 1737 glass substrates were denser than on Si substrtates. Mo—Ti coatings on Corning 1737 glass with thickness around 200 nm demonstrated much better adhesion than those coatings on stainless steel and soda lime glass substrates with thickness around 5 μm, possibly due to better chemical bonding and smaller total stress. Etch rates of Mo—Ti coatings were much lower than those of pure Mo coatings. The resistivity of Mo—Ti coatings were higher than those of pure Mo coatings. The uniformity of Mo—Ti is comparable to previous pure Mo coatings Whereas particular embodiments of this invention have been described above for purposes of illustration, it will be evident to those skilled in the art that numerous variations of the details of the present invention may be made without departing from the invention as defined in the appended claims.

What is claimed:

1. A method for preparing a molybdenum-titanium sputtering target having substantially no β(Ti, Mo) phase present comprising:
   (a) providing powders of molybdenum and titanium wherein said titanium powder is present in an amount of 40-95 atomic %, based on the total atomic % of the molybdenum and titanium powders, the balance being molybdenum powder;
   (b) blending the molybdenum and titanium powders to produce a blended powder;
   (c) optionally, consolidating the blended powder;
   (d) encapsulating the consolidated powder; and
   (e) compacting while heating the encapsulated powder at 700° C. to 950° C. at a pressure from 75 to 175 MPa, to produce a first MoTi target plate.

2. The method of claim 1, wherein in step (e) the compacting is performed at a pressure of 100 to 175 MPa and the heating is carried out at a temperature of 725°-925° C. for a period of 2-16 hours.

3. The method of claim 1, wherein the molybdenum powder has an average particle size of 20 microns or less.

4. The method of claim 1, wherein the titanium powder has an average particle size of 40 to 150 microns.

5. The method of claim 1, wherein the consolidating of step (c) is performed in a cold isostatic press.

6. The method of claim 1, wherein the compacting/heating of step (e) is performed in a hot isostatic press.

7. The method of claim 1, further comprising the steps of:
   (f) removing a portion of the encapsulation on the first target plate;
   (g) bonding the first target plate to a second MoTi target plate along an edge of the first and second plates to produce bonded plates; and
   (h) compacting while heating the bonded plates to produce a bonded target plate.

8. The method of claim 7, wherein the bonded target plate is at least 55 inches by 67 inches in area.

9. The method of claim 7, wherein the compacting and heating of step (h) is hot isostatic pressing carried out at a pressure of 75-175 MPa and a temperature of 750°-850° C.

10. The method of claim 1, wherein said titanium powder is present in an amount of 40-60 atomic %, based on the total atomic % of the molybdenum and titanium powders, the balance being molybdenum powder.

11. The method of claim 1, wherein said titanium powder is present in an amount of 50-60 atomic %, based on the total atomic % of the molybdenum and titanium powders, the balance being molybdenum powder.

12. A method for preparing a molybdenum-titanium sputtering target having substantially no β(Ti, Mo) phase present comprising:
   (a) providing powders of molybdenum and titanium wherein said titanium powder is present in an amount of 40-95 atomic %, based on the total atomic % of the molybdenum and titanium powders, the balance being molybdenum powder;
   (b) blending the molybdenum and titanium powders to produce a blended powder;
   (c) consolidating the blended powder;
   (d) encapsulating the consolidated powder; and
   (e) compacting while heating under pressure the encapsulated powder to produce a first MoTi target plate.

13. The method of claim 12, wherein in step (e) the compacting is performed at a pressure of 75 to 300 MPa and the heating is carried out at a temperature of 725°-925° C. for a period of 2-16 hours.

14. The method of claim 12, wherein the molybdenum powder has an average particle size of 20 microns or less.

15. The method of claim 12, wherein the titanium powder has an average particle size of 40 to 150 microns.

16. The method of claim 12, wherein the consolidating of step (c) is performed in a cold isostatic press.

17. The method of claim 12, wherein the compacting/heating of step (e) is performed in a hot isostatic press.

18. The method of claim 12, further comprising the steps of:
   (f) removing a portion of the encapsulation on the first target plate;
   (g) bonding the first target plate to a second MoTi target plate along an edge of the first and second plates to produce bonded plates; and
   (h) compacting while heating the bonded plates to produce a bonded target plate.

19. The method of claim 18, wherein the bonded target plate is at least 55 inches by 67 inches in area.

20. The method of claim 18, wherein the compacting and heating of step (h) is hot isostatic pressing carried out at a pressure of 75-175 MPa and a temperature of 700°-950° C.

21. The method of claim 12, wherein said titanium powder is present in an amount of 40-60 atomic %, based on the total atomic % of the molybdenum and titanium powders, the balance being molybdenum powder.

22. The method of claim 12, wherein said titanium powder is present in an amount of 50-60 atomic %, based on the total atomic % of the molybdenum and titanium powders, the balance being molybdenum powder.

* * * * *